(12) United States Patent
Lee et al.

(10) Patent No.: US 8,304,922 B2
(45) Date of Patent: Nov. 6, 2012

(54) SEMICONDUCTOR PACKAGE SYSTEM WITH THERMAL DIE BONDING

(75) Inventors: Sangkwon Lee, Kyunggi-Do (KR); Tae Keun Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 199 days.

(21) Appl. No.: 12/729,204

(22) Filed: Mar. 22, 2010

(65) Prior Publication Data

US 2010/0176503 A1 Jul. 15, 2010

Related U.S. Application Data

(62) Division of application No. 11/307,614, filed on Feb. 14, 2006, now Pat. No. 7,714,451.

(60) Provisional application No. 60/593,858, filed on Feb. 18, 2005.

(51) Int. Cl.
*H01L 23/48* (2006.01)
*H01L 23/52* (2006.01)
*H01L 23/40* (2006.01)

(52) U.S. Cl. .......... 257/786; 257/778; 257/E23.06; 438/122

(58) Field of Classification Search .......... 257/713, 257/E23.102
See application file for complete search history.

(56) References Cited

U.S. PATENT DOCUMENTS

| | | | |
|---|---|---|---|
| 4,546,405 A * | 10/1985 | Hultmark et al. | 361/718 |
| 5,229,647 A | 7/1993 | Gnadinger | |
| 5,426,072 A | 6/1995 | Finnila | |
| 6,420,255 B1 | 7/2002 | Takahashi | |
| 6,429,509 B1 | 8/2002 | Hsuan | |
| 6,727,594 B2 | 4/2004 | Wang et al. | |
| 6,797,367 B2 | 9/2004 | Ogawa et al. | |
| 6,808,798 B2 | 10/2004 | Tobita | |
| 6,891,732 B2 | 5/2005 | Takano et al. | |
| 6,960,824 B1 | 11/2005 | Hashemi et al. | |
| 2004/0021220 A1 * | 2/2004 | Kubo | 257/706 |
| 2005/0023033 A1 | 2/2005 | Saiki et al. | |
| 2005/0046002 A1 | 3/2005 | Lee et al. | |
| 2005/0245060 A1 * | 11/2005 | Chiu | 438/612 |

* cited by examiner

*Primary Examiner* — Michelle Mandala
*Assistant Examiner* — Shaka White
(74) *Attorney, Agent, or Firm* — Ishimaru & Associates LLP; Mikio Ishimaru; Stanley M. Chang

(57) ABSTRACT

A semiconductor package system includes providing a substrate having a plurality of thermal vias extending through the substrate. A solder mask is positioned over the plurality of thermal vias. A plurality of thermally conductive bumps is formed on at least some of the plurality of thermal vias using the solder mask. An integrated circuit die is attached to the plurality of thermally conductive bumps. An encapsulant encapsulates the integrated circuit die.

7 Claims, 3 Drawing Sheets

SEMICONDUCTOR PACKAGE SYSTEM WITH THERMAL DIE BONDING

CROSS-REFERENCE TO RELATED APPLICATION(S)

This application is a divisional of U.S. patent application Ser. No. 11/307,614 filed Feb. 14, 2006, now U.S. Pat. No. 7,714,451, which claims the benefit of U.S. Provisional Patent Application Ser. No. 60/593,858 filed Feb. 18, 2005, and the subject matter thereof is hereby incorporated herein by reference thereto.

TECHNICAL FIELD

The present invention relates generally to semiconductor package systems, and more particularly to a semiconductor package system providing enhanced thermal conductivity.

BACKGROUND ART

In the electronics industry, the continuing goal has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Recently, there has been rapid development in semiconductor technology and, as a result, semiconductors are becoming smaller, circuitry within semiconductors is becoming increasingly dense to provide higher speeds. As the density increases however, higher power is used in these semiconductor components. Higher power results in greater heat generation in such semiconductors. Thus, heat dissipation is becoming more critical as semiconductor technology develops to address the increasing demand for semiconductors having higher power and speed.

Various techniques may be used to remove or dissipate heat generated by a semiconductor. One such technique involves the use of a mass of conductive material in thermal contact with the semiconductor. The mass of conductive material typically is referred to as a heat spreader. One of the primary purposes of a heat spreader is to absorb and dissipate the heat generated by the electronic circuitry on the semiconductor and to spread the heat away from the semiconductor. The heat spreader thereby removes the heat from the semiconductor and reduces the likelihood of the occurrence of hot spots that can have an adverse effect on the performance and reliability of the semiconductor.

Heat spreaders are made of a thermally conductive material such as aluminum, electro-plated copper, copper alloy, or ceramic, for example. A heat spreader is positioned in thermal contact with a semiconductor by use of a thermally conductive material, such as thermally conductive gels, greases, or solders, as well as to provide thermal conductivity between the semiconductor and the heat spreader.

An electronic device may comprise at least one semiconductor coupled to a heat spreader and a substrate carrier. Passive electronic components such as capacitors also may be attached to the substrate carrier. Typically, the semiconductor is attached to one side of the substrate carrier by means of a number of solder balls, solder bumps, or other alternative connections. The heat spreader may be formed out of a suitable thermally conductive material such as copper, aluminum, carbon composites, or alternative suitable materials. The heat spreader is typically positioned in thermal contact with the semiconductor by means of a thermal adhesive.

A semiconductor device is produced by mounting, on the multilayer circuit board thus formed, a semiconductor chip or chips and required circuit parts. In recent years, semiconductor elements have had increasingly improved performances, thereby increasing the amount of heat generated therefrom. Conventional methods for dealing with an increased amount of heat generated from such a semiconductor element include a method of dissipating the generated heat by attaching a heat spreader (or heat sink) to the semiconductor element and using a fan. Also, a metal sheet with good heat-dissipating properties is used as a core substrate in order to improve the heat-dissipating properties of a multilayer circuit board on which a semiconductor element is mounted.

However, even with a multilayer circuit board using a metal sheet for a core substrate, the heat-dissipating properties are not always enough considering the increasing amount of heat generated from a semiconductor element, and a multilayer circuit board having better heat-dissipating properties is required to remove the heat generated from a semiconductor element.

It is known to use a member made of a metal to cover a semiconductor element mounted on a multilayer circuit board, to thereby dissipate heat generated by the semiconductor element from the top face of the metallic member to the environment. Again, with a multilayer circuit board using such a cover member, heat-dissipating properties are not always enough to increase amount of heat removed from a semiconductor element, and a multilayer circuit board having improved heat-dissipating properties is again required.

To increase thermal performance of packages, most packages are manufactured using high thermal conductivity epoxy where increasing conductive filler content or solvent loading increases the thermal conductivity. In these cases, the material cost is increased around double compared with conventional epoxy material. At the same time, it is very hard to get stable workability and reliable performance with these packages.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system that includes providing a substrate having a plurality of thermal vias extending through the substrate. A solder mask is positioned over the thermal vias. A plurality of thermally conductive bumps is formed on at least some of the plurality of thermal vias using the solder mask. An integrated circuit die is attached to the plurality of thermally conductive bumps. An encapsulant encapsulates the integrated circuit die.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
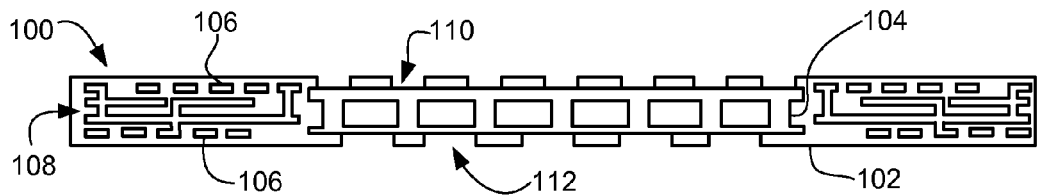
FIG. 1 is a cross-sectional view of a semiconductor package at an intermediate stage of manufacture in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "thermal" as used herein describes structures used only for heat transfer and specifically excludes structures used for electrical transfer. This is to differentiate structures of the present invention from electrically conductive structures whose primary purpose is for conducting electricity but which may incidentally conduct heat since they are made of heat conductive materials as described for the present invention.

Referring now to FIG. 1, therein is shown a cross-sectional view of a semiconductor package 100 at an intermediate stage of manufacture in accordance with an embodiment of the present invention. The semiconductor package 100 includes a substrate 102, such as a printed circuit board (PCB). The substrate 102 has a number of thermal vias 104 formed through the central portion of the substrate 102 where an integrated circuit die (not shown) is to be attached.

Typically, the thermal vias 104 are about 100 microns in width. Each of the thermal vias 104 is lined with a thin thermally conductive coating, such as copper (Cu), having a thickness of about 10 microns. The thermally conductive coating also is formed on the surfaces of the substrate to provide a wettable layer for subsequent application of thermally conductive bumps as discussed below. The substrate typically is provided with the thermal vias 104 formed in the substrate 102 by the substrate manufacturer. There is thus provided a substrate 102 having a number of thermal vias 104 formed therethrough.

It has been discovered that the thermally conductive adhesive is applied efficiently using a screen printing process. A solder mask is positioned over the thermal vias 104 in a suitable pattern as discussed below. The thermally conductive adhesive is formed over the area to which the integrated circuit will be attached in a pattern depending upon the semiconductor package 100 being manufactured as discussed below.

The thermally conductive adhesive typically is reflowed, defluxed, and pre-baked if necessary before attachment of the integrated circuit as described below.

The substrate 102 also includes a number of contacts 106 formed in the upper and lower surfaces of the substrate. The contacts 106 typically are connected using an interconnect array 108 in accordance with the requirements of the semiconductor package 100 being manufactured. As will be discussed below in more detail, the contacts 106 in the upper surface of the substrate 102 are used to electrically connect the integrated circuit die to the substrate 102. The contacts in the lower surface of the substrate 102 are used to electrically connect the substrate 102 to another surface, such as a printed circuit board (PCB), such as by forming a number of solder balls.

Figure 1A:
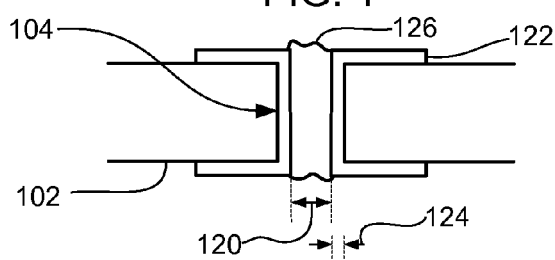
FIG. 1A is an enlarged cross-sectional view of a thermal via manufactured in accordance with an embodiment of the present invention.

Referring now to FIG. 1A, therein is shown an enlarged cross-sectional view of a thermal via 104. The thermal via 104 typically has a width of about 100 microns or greater. The thermal via 104 is lined with a liner 122 of a thermally conductive material, such as copper. The liner 122 typically has a thickness of about 10 microns. The liner 122 provides a wettable surface for a high thermal conductivity filler material 126, such as a high thermal conductivity solder. The thermal vias typically are formed in the central portion of the substrate 102.

Figure 2:
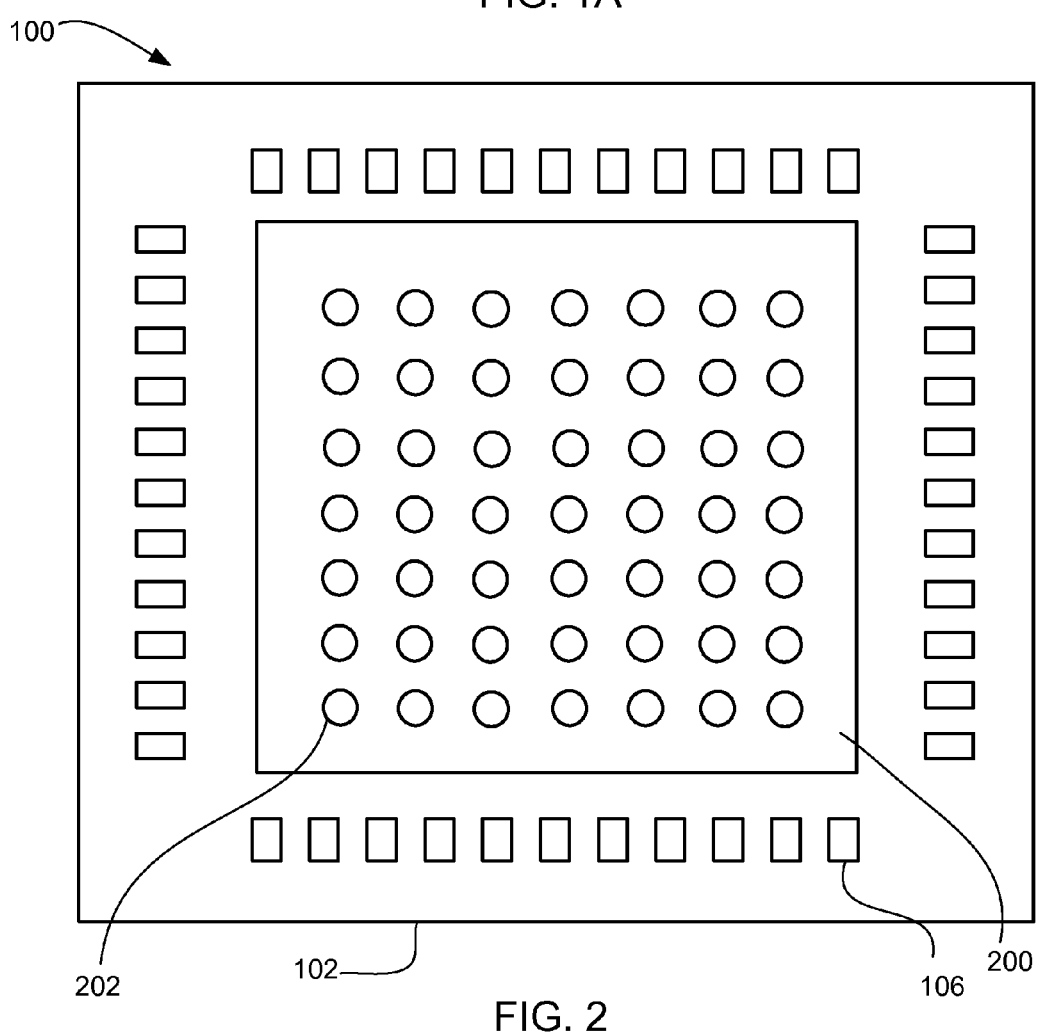
FIG. 2 is a top plan view of the structure of FIG. 1.

Referring now to FIG. 2, therein is shown a top plan view of the structure of FIG. 1. The semiconductor package 100 includes the substrate 102. Typically, the contacts 106 are formed around the periphery of the substrate 102. The central portion of the substrate 102 has the number of thermal vias 104.

Figures 3A, 3B, 3C:
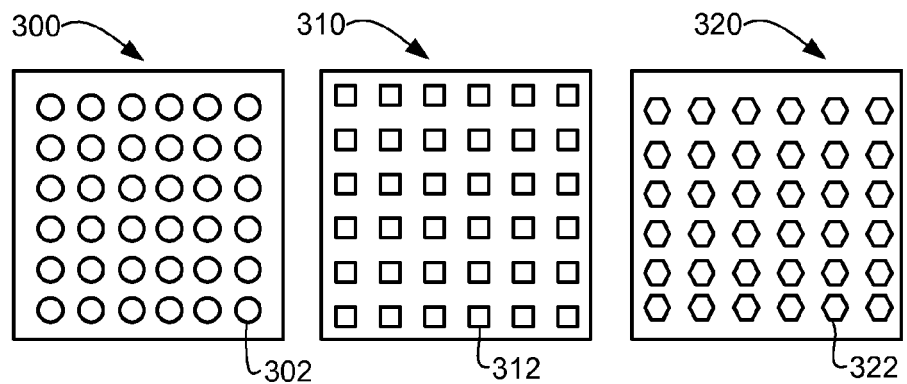
FIG. 3A is a plan view of a solder mask having circular openings.
FIG. 3B is a plan view of a solder mask having square openings.
FIG. 3C is a plan view of a solder mask having hexagonal openings.

Referring now to FIG. 3A, therein is shown a plan view of a solder mask 300 having a number of openings 302 of a circular shape formed in a close packed square pattern.

Referring now to FIG. 3B, therein is shown a plan view of a solder mask 310 having a number of openings 312 of a quadrangle shape formed in a close packed square pattern.

Referring now to FIG. 3C, therein is shown a plan view of a solder mask 320 having a number of openings 322 of a hexagonal shape formed in a close packed square pattern.

It will be apparent to those skilled in the art upon a reading of this description that other shapes and arrangements of the thermal vias may be used in a particular design.

Figures 4A, 4B, 4C:
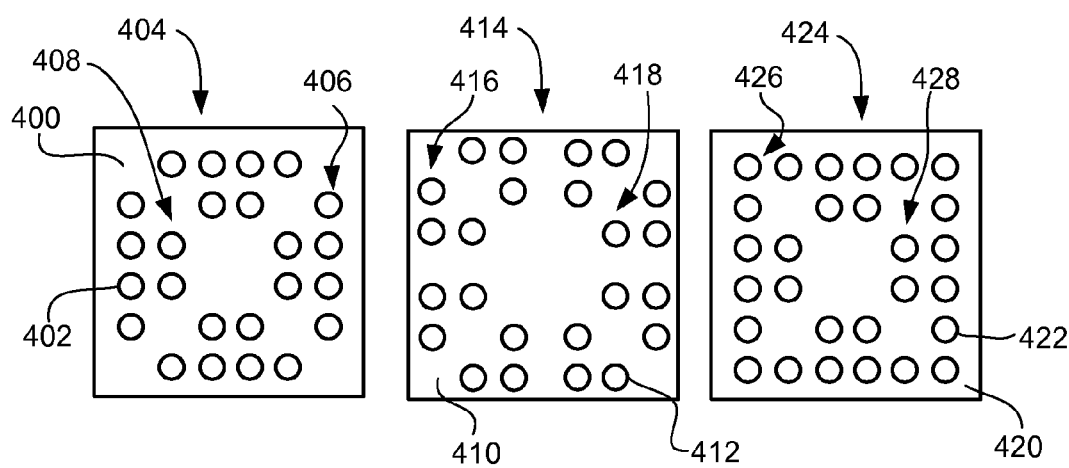
FIG. 4A is a plan view of a solder mask having circular openings arranged in a first open array pattern.
FIG. 4B is a plan view of a solder mask having circular openings arranged in a second open array pattern.
FIG. 4C is a plan view of a solder mask having circular openings arranged in a third open array pattern.

Referring now to FIG. 4A, therein is shown a plan view of a solder mask 400 having a number of openings 402 of a circular shape arranged in a first open array pattern 404. The first open array pattern 404 has an outer array 406 of the openings 402 around the periphery of the solder mask 400 except at the corners thereof. An inner array 408 of the openings 402 is formed interior to the outer array 406 except at the corners thereof. The area central to the inner array 408 has none of the openings 402.

Referring now to FIG. 4B, therein is shown a plan view of a solder mask 410 having a number of openings 412 of a circular shape arranged in a second open array pattern 414. The second open array pattern 414 has an outer array 416 of the openings 412 around the periphery of the solder mask 410 except at the corners thereof. The openings 412 in the outer array 416 are spacer farther apart from each other than the openings 412 in the first open array pattern 404 referred to in FIG. 4A. An inner array 418 of the openings 412 is formed interior to the outer array 416 except at the corners thereof. The openings 412 in the inner array 418 also are spaced farther apart than the openings 402 in the inner array 408 shown in FIG. 4A. The area central to the inner array 418 has none of the openings 412.

Referring now to FIG. 4C, therein is shown a plan view of a solder mask 420 having a number of openings 422 of a circular shape arranged in a third open array pattern 424. The third open array pattern 424 has an outer array 426 of the openings 422 around the periphery of the solder mask 420 including at the corners thereof. The openings 422 in the outer array 426 are spacer closer together to each other than the openings 402 in the first open array pattern 404 referred to in FIG. 4A and the second open array pattern 414 referred to in FIG. 4B. An inner array 428 of the openings 422 is formed interior to the outer array 426 except at the corners thereof. The openings 422 in the inner array 428 also are spaced closer together to each other than the openings 412 in the inner array 418 shown in FIG. 4B. The area central to the inner array 428 has none of the openings 422.

The variety of examples of array patterns shown in FIGS. 4A, 4B, and 4C are shown to demonstrate the flexibility available to provide various patterns of openings in the solder mask depending upon the particular design considerations for a given semiconductor package. It will be apparent to those skilled in the art upon a reading of this description that other array patterns may be used as well. The heat dissipation characteristics of a particular semiconductor package thus can be relatively closely controlled by the design of the solder mask being used.

Figure 5:
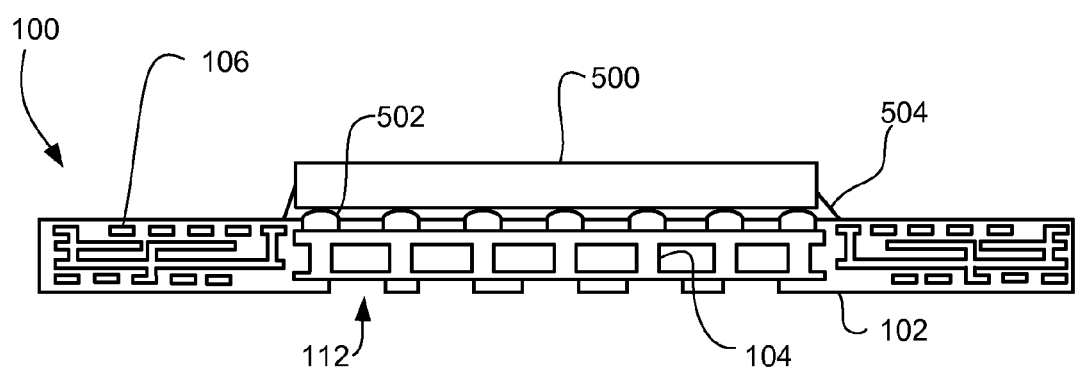
FIG. 5 is the structure of FIG. 1 with an integrated circuit die attached.

Referring now to FIG. 5, therein is shown the structure of FIG. 1 with an integrated circuit die 500 attached. An inactive side of the integrated circuit die 500 is attached to the thermal vias 104 using a number of thermally conductive bumps 502. The thermally conductive bumps 502 typically comprise a thermally conductive material, such as at least one of a high thermal epoxy, a eutectic solder paste, a tin-silver solder paste, compounds thereof, alloys thereof, and combinations thereof.

High thermal epoxies are those epoxies having a thermal coefficient of at least about 20 W/mK. Typical eutectic solder pastes are tin-lead (Sn/Pb) solder pastes with a composition of about 63% Sn to about 37% Pb having a thermal coefficient of at least about 50 W/mK. Suitable tin-silver (Sn/Ag) solder pastes with a composition of about 96% Sn to about 4% Ag have a thermal coefficient of at least about 221 W/mK.

It has been discovered that the use of a particular thermally conductive material to form the thermally conductive bumps 502 in combination with the arrays of the thermal vias 104 shown and described above with reference to FIGS. 3A, 3B, 3C, 4A, 4B, and 4C provide a wide range of design capabilities that variously can be used to meet the design requirements of a the semiconductor package 100.

An adhesive 504 is used to physically attach the integrated circuit die 500 to the substrate 102. The adhesive can be any suitable adhesive, such as an epoxy, that is used in semiconductor manufacturing processes. It will be noted by one skilled in the art upon a reading of this description that the adhesive 504 can be selected primarily for its adhesive capabilities without regard for its thermal conductivity. The thermal conductivity from the integrated circuit die 500 through the thermal vias 104 is provided by the thermally conductive bumps 502. Consequently, a less expensive adhesive can be used to physically attach the integrated circuit die 500 to the substrate 102.

Additionally, the screen printing can be performed at the same time as the integrated circuit die 500 is mounted thereby requiring no significant additional processing.

Figure 6:
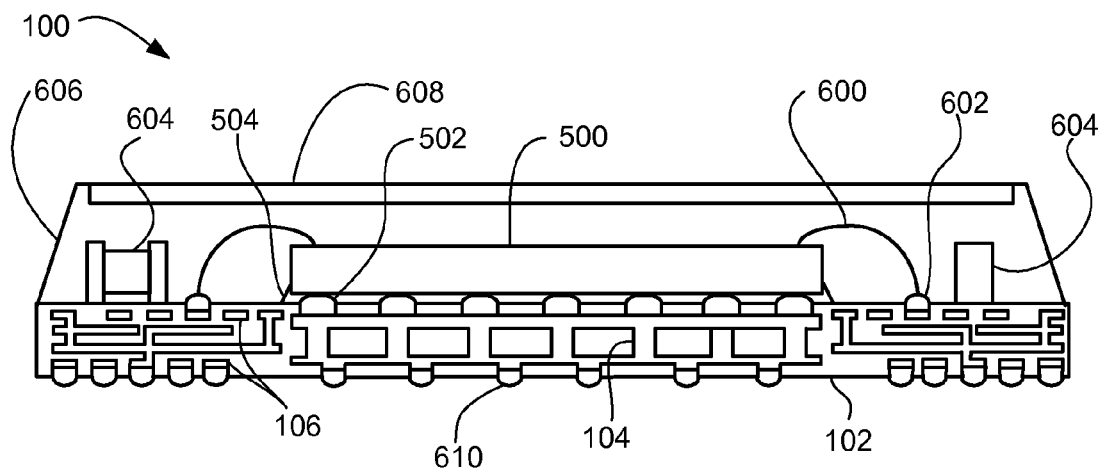
FIG. 6 is the structure of FIG. 5 after encapsulation.

Referring now to FIG. 6, therein is shown the structure of FIG. 5 after encapsulation. The integrated circuit die 500 is electrically connected to the contacts 106 on the substrate 102 using a number of wires 600. The wires 600 are connected to the integrated circuit die 500 and the contacts 106 in the substrate 102 using a wire bonding process. The wires 600 may be connected to the contacts using a solder bump 602.

A number of passive components 604 also may be attached to the substrate 102 depending upon the design requirements of the semiconductor package 100 in question.

An encapsulant 606 is formed over the substrate 102 using a molding process to encapsulate the integrated circuit die 500. A heat sink 608 also may be placed in the encapsulant 606 to provide a means for dissipating heat generated by the semiconductor package 100 during operation.

A number of solder balls 610 are formed on the bottom of the substrate 102 in contact with the contacts 106 in the lower surface of the substrate 102 and in contact with the lower surfaces of the thermal vias 104.

It has been discovered that the semiconductor package system of the present invention provides a variably controllable system for dissipating heat from a semiconductor package without the use of expensive thermally conductive epoxies having increased filler content or solvent loading. The present system can be used in a variety of semiconductor packages to control heat dissipation using conventional manufacturing processes and technologies.

In terms of process flow, a screen print process is performed to form the thermally conductive bumps 502. A solder mask is positioned over the substrate 102 in a selected pattern. Solder then is formed over the solder mask. The solder typically is reflowed, defluxed and a pre-bake process is performed. The integrated circuit die 500 is attached using the adhesive 504. The adhesive 504 is then cured. The integrated circuit die 500 is then wire bonded to the contacts 106 on the upper surface of the substrate 102. The heat sink 608 typically is then attached during the encapsulant molding process. The solder balls 610 are then attached, and a singulation process is performed to form the semiconductor package 100.

Figure 7:
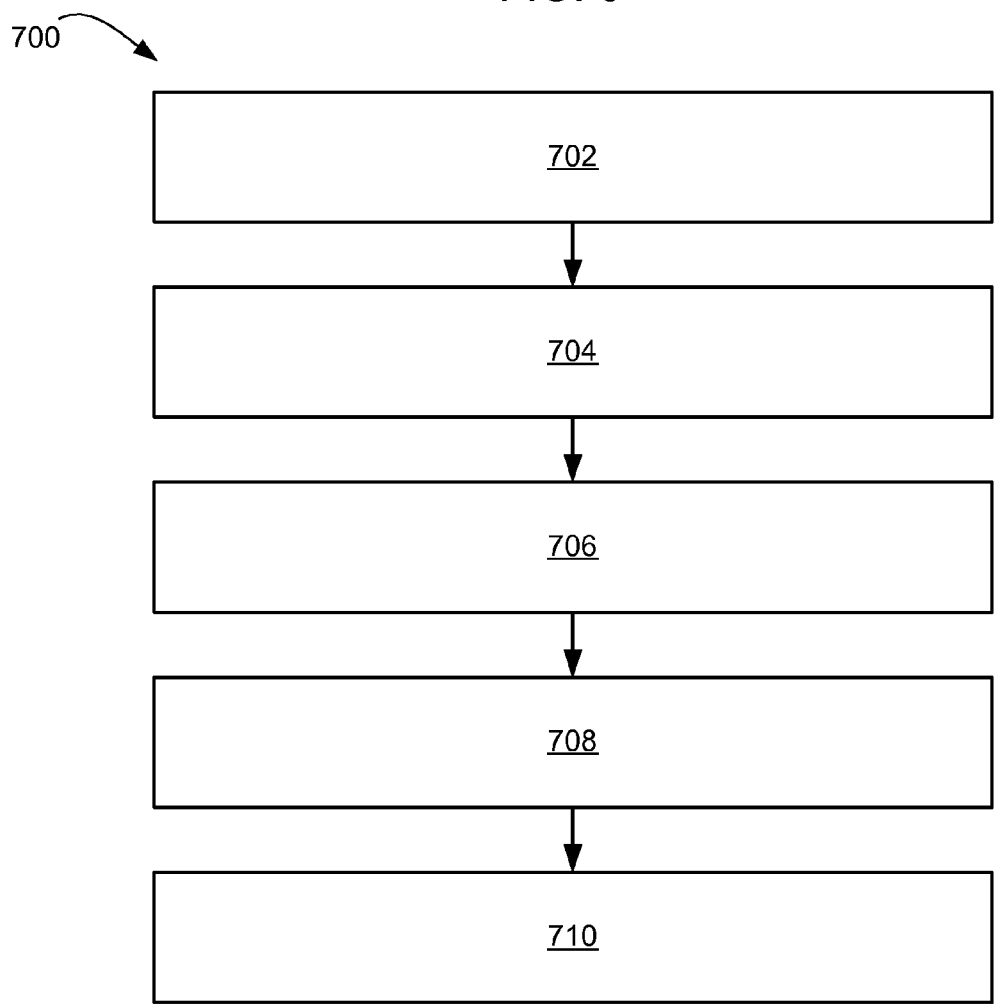
FIG. 7 is flow chart of a method in accordance with an embodiment of the present invention.

Referring now to FIG. 7, therein is shown a flow chart of a semiconductor package system 700 in accordance with the present invention. The semiconductor package system 700 includes providing a substrate having a plurality of thermal vias extending through the substrate in a block 702; providing a solder mask over the plurality of thermal vias in a block 704; forming a plurality of thermally conductive bumps on at least some of the plurality of thermal vias using the solder mask in a block 706; attaching an integrated circuit die to the plurality of thermally conductive bumps in a block 708; and encapsulating the integrated circuit die in a block 710.

Thus, it has been discovered that the semiconductor package system of the present invention furnish important and heretofore unavailable solutions, capabilities, and functional advantages for dissipating heat. The resulting process and configurations are straightforward, economical, uncomplicated, highly versatile and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A semiconductor package system, comprising:
   a substrate having a plurality of thermal vias extending through the substrate;
   a plurality of thermally conductive bumps on at least some of the plurality of thermal vias;
   an integrated circuit die having an inactive side attached to the plurality of thermally conductive bumps;
   an encapsulant encapsulating the integrated circuit die;
   a plurality of contacts on the upper and lower surfaces of the substrate; and
   an interconnect array connecting the plurality of contacts on the upper and lower surfaces of the substrate.

2. The semiconductor package system as claimed in claim 1, wherein:
   the plurality of thermally conductive bumps comprises a thermally conductive material having a thermal conductivity greater than that of the substrate.

3. The semiconductor package system as claimed in claim 1, wherein:
   the plurality of thermally conductive bumps comprises at least one of a high thermal epoxy, a eutectic solder paste, a tin-silver solder paste, compounds thereof, alloys thereof, and combinations thereof.

4. The semiconductor package system as claimed in claim 1, wherein:
   the plurality of thermally conductive bumps on at least some of the plurality of thermal vias are in an array of at least one of a close packed array, an open array, and combinations thereof.

5. The semiconductor package system as claimed in claim 1, wherein:
   the plurality of thermal vias extending through the central portion of the substrate comprises a wettable surface on the plurality of thermal vias.

6. The semiconductor package system as claimed in claim 1, wherein:
   the plurality of thermally conductive bumps on at least some of the plurality of thermal vias are in an array of at least one of a close packed array, an open array, and combinations thereof.

7. The semiconductor package system as claimed in claim 1, wherein:
   the plurality of thermally conductive bumps comprises at least one of a high thermal epoxy, a eutectic solder paste, a tin-silver solder paste, compounds thereof, alloys thereof, and combinations thereof attaching the integrated circuit die to the plurality of thermal vias.

* * * * *